(12) United States Patent  
Tasch et al.

(10) Patent No.: US 8,766,283 B2
(45) Date of Patent: Jul. 1, 2014

(54) LIGHT-EMITTING DIODE ARRANGEMENT WITH HEAT DISSIPATING PLATE

(75) Inventors: Stefan Tasch, Jennersdorf (AT); Hans Hoschopf, Jennersdorf (AT)

(73) Assignee: Tridonic Optoelectronics GmbH, Jennersdorf (AT)

( * ) Notice: Subject to any disclaimer, the term of this patent is extended or adjusted under 35 U.S.C. 154(b) by 953 days.

(21) Appl. No.: 10/578,362

(22) PCT Filed: Nov. 3, 2004

(86) PCT No.: PCT/EP2004/012438
§ 371 (c)(1),
(2), (4) Date: Jan. 16, 2007

(87) PCT Pub. No.: WO2005/048358
PCT Pub. Date: May 26, 2005

(65) Prior Publication Data
US 2007/0138488 A1    Jun. 21, 2007

(30) Foreign Application Priority Data
Nov. 7, 2003   (DE) .................................. 103 51 934

(51) Int. Cl.
*H01L 27/15*    (2006.01)

(52) U.S. Cl.
USPC ................ 257/81; 257/99; 257/E33.068

(58) Field of Classification Search
USPC .............. 257/88, E33.068, 81, 93, 99, 709
See application file for complete search history.

(56) References Cited

U.S. PATENT DOCUMENTS

| | | | | |
|---|---|---|---|---|
| 5,067,007 A | * | 11/1991 | Otsuka et al. | 257/701 |
| 5,512,131 A | * | 4/1996 | Kumar et al. | 438/738 |
| 6,139,171 A | * | 10/2000 | Waldmann | 362/494 |
| 6,498,355 B1 | * | 12/2002 | Harrah et al. | 257/99 |
| 6,682,331 B1 | * | 1/2004 | Peh et al. | 425/112 |
| 2001/0001207 A1 | * | 5/2001 | Shimizu et al. | 257/98 |
| 2001/0010449 A1 | | 8/2001 | Chiu et al. | 313/501 |
| 2004/0065894 A1 | * | 4/2004 | Hashimoto et al. | 257/100 |
| 2005/0072981 A1 | * | 4/2005 | Suenaga | 257/88 |

FOREIGN PATENT DOCUMENTS

| | | | | |
|---|---|---|---|---|
| EP | 1 398 839 | 3/2004 | ............. | H01L 33/00 |
| JP | 2001-217467 | 8/2001 | ............. | H01L 33/32 |
| JP | 2003-008069 | 1/2003 | ............. | H01L 33/32 |
| JP | 2003-318448 | 11/2003 | ............. | H01L 33/32 |
| WO | WO 02/089221 | 11/2002 | ............. | H01L 33/00 |
| WO | WO 03/019679 | 3/2003 | ............. | H01L 33/32 |
| WO | WO 03/030274 | 4/2003 | ............. | H01L 33/64 |

* cited by examiner

*Primary Examiner* — Tucker Wright
(74) *Attorney, Agent, or Firm* — Fitzpatrick, Cella, Harper & Scinto

(57) ABSTRACT

The invention relates to a light-emitting arrangement, having:—at least one light-emitting diode chip (1),—a multi-layer board (17) having a base (5) of a thermally well conducting material, in particular of metal, and—an electrical insulating and thermally conducting connection layer (2) between the emission surface of the light-diode chip (1) and the board (17).

22 Claims, 3 Drawing Sheets

LIGHT-EMITTING DIODE ARRANGEMENT WITH HEAT DISSIPATING PLATE

Figure 1:
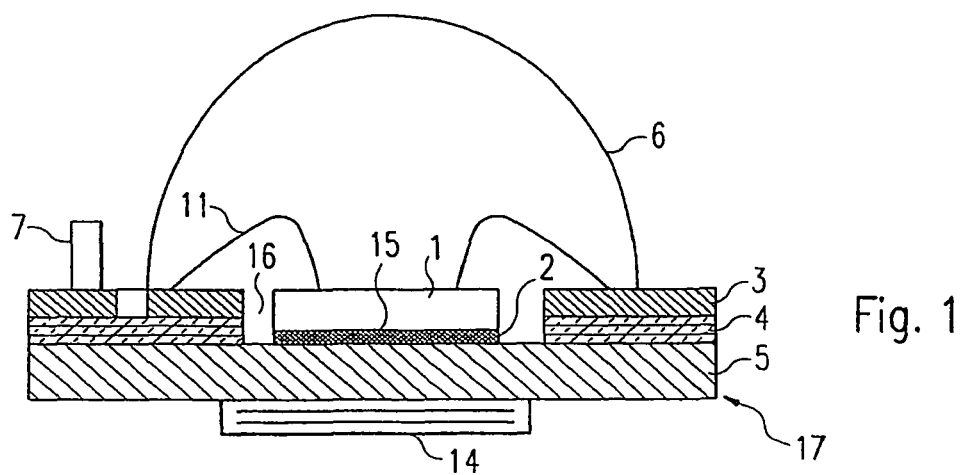

This application is a national stage application under 35 U.S.C. §371 of International application No. PCT/EP2004/012438, filed Nov. 3, 2004, which claims the benefit of German Application No. 103 51 934.3, filed Nov. 7, 2003, the priorities of both of which are hereby claimed. The International Application is incorporated by reference herein in its entirety, and was published in German as International Publication No. WO 2005/048358 on May 26, 2005.

The present invention relates to a light emitting diode arrangement, in which LED dice (light-emitting diode chips) are arranged on a heat dissipating plate.

In order to realize applications with LEDs having higher brightness, in recent times there are put to use ever increasingly high power LEDs having an operating power of more than 1 watt (electrical). The chip area of these LED dice is, at the present time, in the region of 1mm2. It is to be expected that in the future the operating power per LED will be increased further, which on the one hand will be achieved by means of larger semiconductors, and on the other hand by means of higher current densities. Specifically the increase of the current densities brings about that the power densities of LEDs in the near future may increase from the present maximum of 1 to 2 $\text{watts}_{electrical}/\text{mm2}$ to above 4 $\text{watts}_{electrical}/\text{mm2}$.

With increase of the power densities it is necessary at the same time to provide that the correspondingly likewise increased heat losses are dissipated, in order to ensure that the heat losses are sufficiently discharged from the semiconductor.

A too great heating of the LEDs during operation leads namely, inter alia, to destruction of components. For this reason it must be ensured during the operation of the LEDs that the temperature at the boundary layer of the p-n junction in the LED does not exceed, for example, 125° C. This danger consists, more precisely stated, in that only a part of the electrical power taken up by the LED is transformed into light, whilst the other part is converted into heat (at the present time the light efficiency of LEDs is still below 10%). The operating parameters of LEDs are thus to be selected, in dependence upon the kind of installation (assembly), the mounting and environmental conditions, such that the boundary layer temperature of the LED does not exceed for example 125° C.

The invention, to that effect, is based on the assessment that the heat losses can be more efficiently dissipated by means of improvement of the thermal resistance of the arrangement. If, in accordance with the invention, the heat can be well dissipated through slight thermal resistance, this can then be passed on to the carrier of the LED without a great temperature difference. Thereby, the thermal resistance is expressed in K(Kelvin)/W(Watt).

In accordance with the state of the art there are known arrangements for high-power LEDs which typically have a thermal resistance of more than 15 K/W in the region of from the boundary layer to the LED carrier (plate or the like). This means that in accordance with the state of the art, the temperature difference between the LED carrier and the active zone (boundary layer) of the LED, with operation at 5 $W_{electrical}$, would be up to 75 Kelvin. Based on the above-mentioned maximum permissible boundary layer temperature in continuous operation, this means that with an environmental temperature of for example 40° C. the temperature drop over a heat exchanger (cooling body), may be a maximum of 10° C. This would in turn require a cooling surface area of 350 cm2, which very clearly gives rise to problems. Beyond this, a use at temperatures above 50° C. would be virtually impossible, which would make the employment of the LEDs for certain technical applications, for example in the field of motor vehicles, impossible.

From the state of the art it is known to employ as LED carrier printed circuit boards (PCBs). Conventionally, these have an organic epoxide resin which thermally conducts only very poorly and thus makes more difficult the thermal dissipation of the heat losses from the LEDs on the carrier.

Alternatively, there are also known ceramic boards, which have better thermal characteristics in comparison to the circuit boards based on epoxide resin, but are however very brittle and susceptible to breakage, which more than restricts their employment as carrier material.

In technical high power applications, in accordance with the state of the art, there are also put to use metal core boards. These typically have a sandwich-like structure based on a metal core base, an insulation layer and a conductor path.

In consideration of this state of the art, it is the object of the present invention to propose an installation arrangement for light-emitting diodes having improved heat dissipation.

Thereby, the invention is based on the insight that in accordance with the state of the art, in the employment of metal core boards, the dissipation of the heat losses from the LED, which is placed on the conductor path, is restricted by the insulation layer lying thereunder, which in turn restricts the power density of the LED.

The indicated object is achieved in accordance with the invention by means of the features of the independent claims. The dependent claims further develop the central concept of the invention in particularly advantageous manner.

In accordance with the invention there is thus provided a light-emitting diode arrangement having at least one light emitting diode chip (LED die). Further, there is provided a multi-layer board having a base of a thermally well conducting material, such as for example metal, wherein an electrically insulating and thermally well conducting connection layer is arranged between the emission area of the light-emitting diode chip and the base. Since, in contrast to the state of the art, the thermally insulating (epoxide) layer is not required, the heat transfer from the light-emitting diode chip to the heat dissipating base material of the board is significantly improved.

The electrically insulating connection layer may be for example the bounding surface of the light-emitting diode chip or its substrate base (e.g. sapphire), which is towards the board.

Alternatively or additionally, the connection layer may also have an adhesive layer which taken for itself may already be electrically insulating.

Such an insulating adhesive layer, which may be e.g. realized by means of an adhesive foil, is in particular of advantage when a light-emitting diode chip is employed of which the surface towards the base is electrically conducting. In this case there must be effected a specific electrical insulation between the chip and the base, in order to avoid short circuits and ESD failures.

The light-emitting diode chip may be accommodated in a depression of the board. Thereby, the light-emitting diode chip may be so sunken in, that its upper side does not project beyond the contour of the board and for example ends plane with the upper side of the board.

The depression in which the LED chip is placed may thereby be formed in the heat discharging base of the board.

At the same time, the depression may have further functions. For example the depression may have a reflector effect, whereby advantageously the walls of the depression may be at least partially bevelled.

The light-emitting diode chip can be so applied that the substrate of the light emitting diodes is towards the board, whereby in this case the substrate may be formed of an electrically insulating material such as, for example, sapphire. This kind of installation is often referred to in the specialist terminology of the art also as "Face Up".

In this respect, the "Face Down" installation technique is also conceivable, with which the light-emitting diode chip is so arranged that the substrate of the light-emitting diode is away from the board. In this case, there may be arranged between the light emitting diode chip and the board an intermediate carrier separate from these components, with which intermediate carrier the light-emitting diode chip is electrically contacted.

The side of the intermediate carrier towards the board may be electrically insulating, whereby the region of the intermediate carrier towards the light-emitting diode chip may have conductive regions, such as for example conductor paths.

At least the region of the at least one light-emitting diode chip may be covered by a lens, such as for example a Fresnel lens.

The region between the board and the lens may be at least partially filled with a colour conversion material. The colour conversion material may thus be arranged neighbouring and/or above the light-emitting diode chip. If applicable, also the depression, to the sides of the chip, may be filled with a colour conversion material, in order to obtain a LED having a substantially whiter light characteristic.

The light-emitting diode chip may be contacted by means of wires from a circuit board, whereby this circuit board is applied to the board to the side of the light-emitting diode chip sandwich-like by means of an insulating layer lying therebetween.

In accordance with a further aspect of the present invention, there is proposed a light-emitting diode arrangement having a sandwich structure. This structure thereby has a thermally well conducting layer, for example of metal, an electrically insulating layer and a circuit board. The electrically insulating layer and the circuit board thereby have recesses lying over one another, so that the thermally conducting layer is exposed in the region of these recesses in the direction of the upper side; that is, the electrical insulating layer is exposed. At least one light-emitting diode chip can be placed in the region of this recess on the thermally well conducting layer.

Thereby the light-emitting diode chip may be electrically contacted to the side from the circuit board.

Further features, advantages and characteristics of the present invention will now be explained with reference to the Figures of the accompanying drawings.

Figure 2:
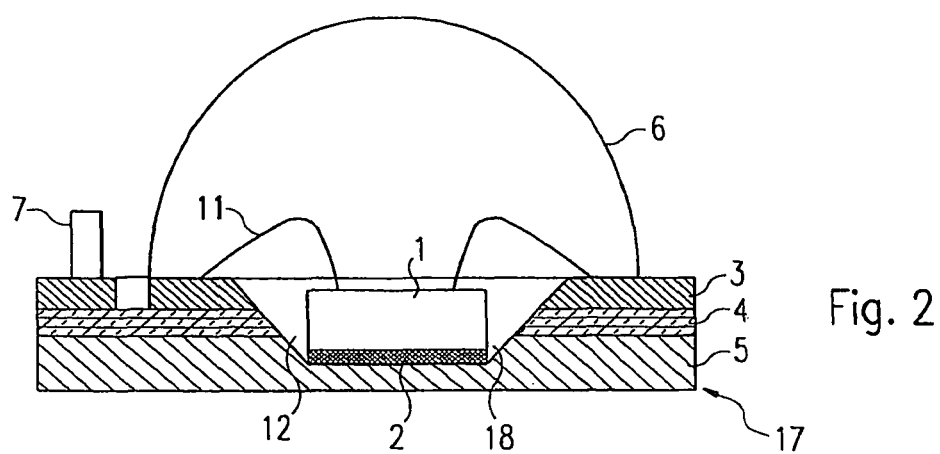
Figure 3:
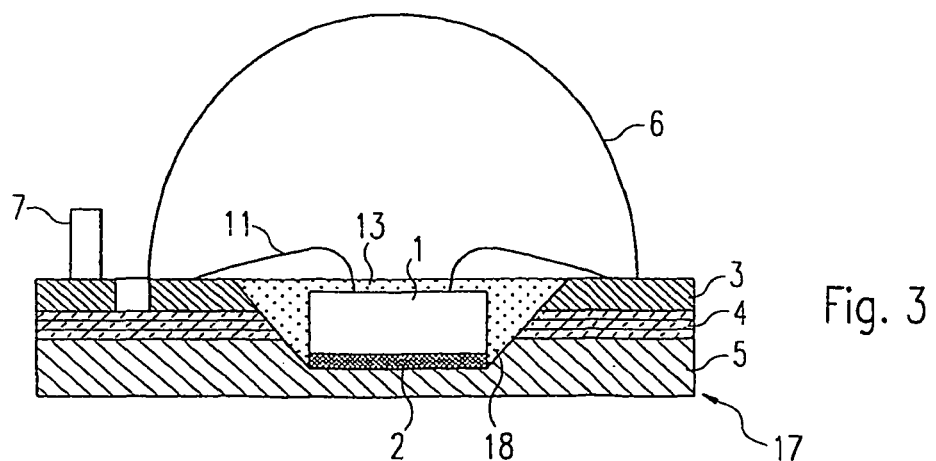
Figure 4:
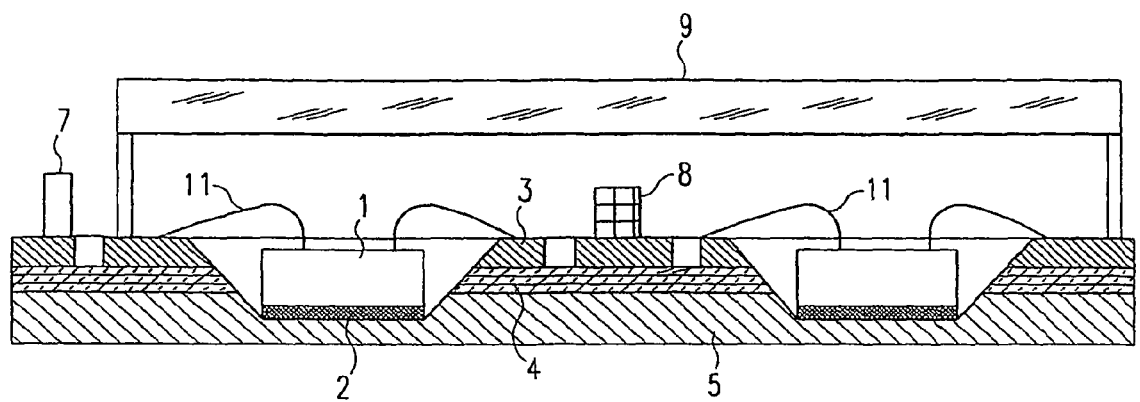
Figure 5:
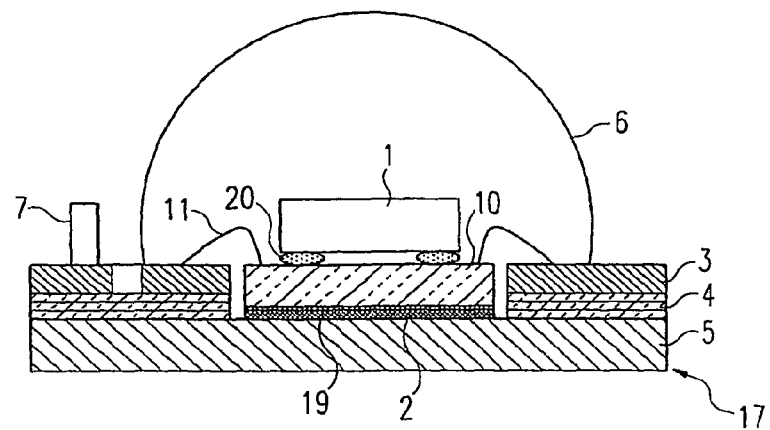
Figure 6:
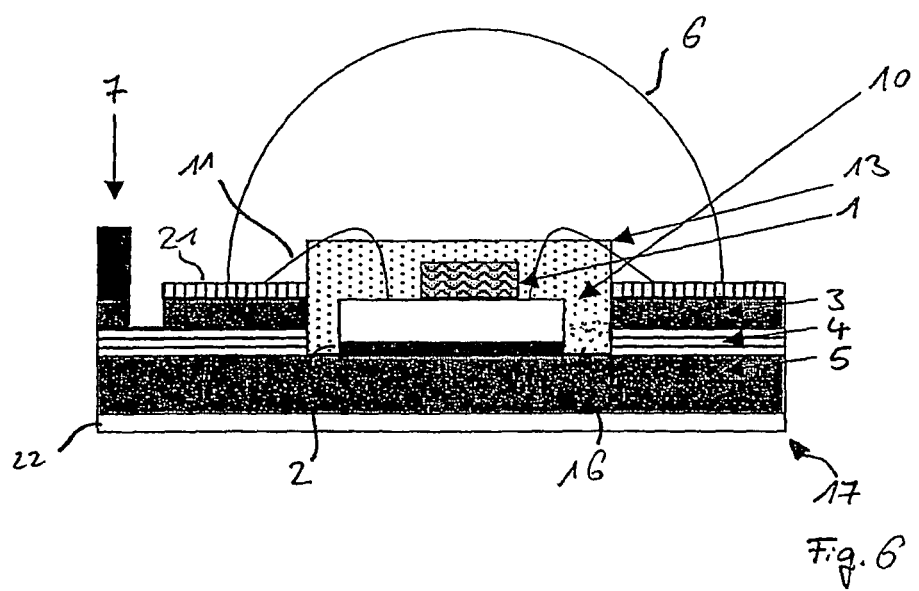

FIG. 1 shows a first exemplary embodiment of the invention,

FIG. 2 shows a modification of FIG. 1, to the effect that in the metal base material there is provided a depression in which the LED die is put in place, FIG. 3 shows a modification of FIG. 2, to the effect that the depression of the carrier is overall filled with a colour conversion material, FIG. 4 shows how an LED arrangement of a plurality of LED dice may be covered by a flat Fresnel lens, FIG. 5 shows an exemplary embodiment in which the LED die is mounted "Face Down", and FIG. 6 shows a further exemplary embodiment in which the LED die is mounted "Face Down".

As already mentioned above, in accordance with the present invention, a LED die is to be placed as directly as possible on the heat dissipating base, for example of a metal core board. In this step, the problem must be overcome that LED dies are frequently conductive over the LED substrate or over their surface towards the base, through which with such an arrangement a short circuit to the circuit board base material can arise, which is often undesired and in particular with regard to the connection possibilities of the LEDs allows no design freedom at all.

Thus, as can be seen from FIG. 1, an LED die is placed on the base material (for example metal) 5 of a metal core board 17 by means of a thermally conductive but electrically insulating layer 2.

The metal core board 17 has, along with this base metal core 5, an electrically insulating layer 4 lying thereabove and an electrically conductive layer having conductor paths 3, whereby preferably the electrically insulating layer 4 and the conductor path layer 3 have corresponding recesses 16, in which the LED die 1 is put in place.

The electrical contacting of the LED die is effected with this arrangement, in which the substrate of the LED die is towards the board 1), to the side of the conductor path 3 by means of wires 11 on the upper side of the LED dice 1.

On the underside of the base material 5 of the metal core board 7 there may be arranged further cooling bodies 14 of known kind.

In particular the region of the LED die 1 and of the recess 16 may be covered by a substantially calotte-shaped lens 6, which bundles the light emitted from the LED die 1.

The electrical contacting of the LED arrangement illustrated in FIG. 1 may be effected by plug-in contacts 7 etc. provided outside the region covered by the lens 6.

As the base material 5 of the board 17 there is put to use in general a material having high thermal conductivity, so that preferably metals, such as for example aluminium or copper, may be put to use.

The electrically insulating but thermally conductive connection layer 2 may be for example an non-conducting substrate layer of the LEDs (for green LEDs there is e.g. often employed sapphire) or, however, also a thermally conductive and electrically insulating adhesive. The electrically insulating but thermally conductive connection layer 2 can thus be part of the LED die 1, of the multi-layer board 17, and/or a layer separate therefrom. The separate layer is in particular necessary if the LED dies 1 are so arranged that their surface towards the multi-layer board 17 is electrically conductive. Further, for example in the case of red LEDs, which are of two diode layers arranged above one another, one of the two layers is always towards the multi-layer board 17, for which reason, for the avoidance of short circuits and ESD failures, a separate insulation is necessary.

The insulation layer 4 of the metal core board 17 may be for example of organic materials or thin ceramics (the latter are, for example, pasted onto the metal carrier 5, or the metal carrier is coated with a burned-in ceramic tape.

In the exemplary embodiment of FIG. 2, the base 5 of the board 17 likewise has a depression 18 in which the LED die 1 is placed. Since the walls of this depression 18 in the metallic base material 5 of the board 17 are bevelled, these metallic walls of the depression 18 may advantageously provide a mirror or reflector effect. Further, also a different shaping of the walls and/or of the floor of the depression is conceivable, which manifests mirror or reflector effects.

Thus, the base material 5 of the multi-layer board 17 serves not only for attachment and heat dissipation of the LED die 1, but also for purposive light directing, in direction away from the board. This light directing by means of the reflector effect of the depression 18 in the base material 5 of the board 17 is preferably adapted to the effect of the lens 6.

It is known from the state of the art, that by means of colour conversion agents "white LEDs" can be attained. Such LEDs are often also called in the specialist field "phosphor converter LEDs" or "luminescent conversion LEDs". As can be seen from FIG. 3, such a colour conversion material 13 can be applied directly on the LED, in the intermediate space between lens 6 and the LED die 1 or, however, in accordance with a particularly preferred configuration illustrated in FIG. 3, may be arranged to fill the depressions 12, 18, so that the filler material ends flush with the upper side of the conductor path layer 3 of the board 17.

In the case of the configuration of FIG. 4, the calotte-shaped lens is replaced by a flat Fresnel lens 9. At the same time it can be seen from FIG. 4 that such a lens may cover a plurality of LED dies 1. In the region between two LEDs and below the Fresnel lens 9 there may be provided control electronics 8 for the LEDs (constant current source etc.).

The exemplary embodiments of FIGS. 1 to 4 show all LED dies which are arranged "Face Up", that is with the LED substrate downwardly (in the direction of the base material 5 of the board 17).

FIG. 5 now shows the opposite case; that is, in accordance with FIG. 5 the LED die 1 is arranged "Face Down", so that the substrate of the LEDs faces away from the metal core of the board 17. In this case the LED die 1 is arranged on an intermediate carrier 10 by means of a conductive adhesive 20. The conductive adhesive 20 has for example a thickness of less than 10 μm and has a thermal conductivity of more than 2 W/mK. The electrical contacting of the LED dice 1 of FIG. 5 is thus effected via wires 11, which are connected with the intermediate carrier 10. Such "Face Down" mounted LED dies generally have, in comparison with "Face Up" mounted LED dies, a higher degree of efficiency.

The intermediate carrier 10 is for example of a ceramic material and has conductor paths on its upper side, whilst the underside is, if applicable, electrically insulated with respect to the metal core 5 of the board 17 by means of a further insulation layer 19. In turn, the insulation layer 19 is also so configured that it is thermally well conducting.

Finally, in FIG. 6 a last exemplary embodiment is shown, in which the LED die 1 is again arranged "Face Down" on an intermediate carrier 10, in order to attain improved light emission with this arrangement, and therewith greater brightness. In the case of this intermediate carrier there is involved preferably an AlN (aluminium nitride) ceramic carrier substrate, which has excellent heat conducting characteristics and at the same time acts in an electrically insulating manner. The advantage in the employment of this supplementary intermediate carrier 10 consists in that a higher ESD (ElectroStatic Discharge) resistance is attained and the metal core board remains electrically neutral.

Supplementary to the configuration in FIG. 5, the LED die 1 is now surrounded with a colour conversion material 13, in order to transform the light into a desired (mixed) colour. The upper side of the electrically conductive layer 3 is further covered with an additional adhesive layer 21, the task of which is to fix the lens 6. Finally, in the illustrated exemplary embodiment, there is provided at the underside of the board 17 also a double-sided adhesive band 22 which makes possible a simple attachment of the overall light-emitting diode arrangement.

The invention claimed is:

1. A light-emitting diode arrangement, comprising:
a light-emitting diode chip;
a multi-layer board having a base layer of a thermally well-conducting material, the material including a metal, the base layer being a core of the board and configured for heat dissipation;
an intermediate carrier separate from the light-emitting diode; and
an electrically insulating and thermally conducting connection layer arranged directly on the base layer of the multi-layer board, the intermediate carrier being arranged over the electrically insulating and thermally conducting connection layer, and wherein there is no electrically conducting layer between one opposing surface of the intermediate carrier and one opposing surface of the electrically insulating and thermally conducting connection layer, and
wherein the base layer is a farthest one of a plurality of layers of the multi-layer board from the light-emitting diode chip.

2. The light-emitting diode arrangement according to claim 1, wherein the electrically insulating and thermally conducting connection layer is at least an adhesive layer.

3. The light-emitting diode arrangement according to claim 1, wherein the light-emitting diode chip is accommodated in a depression of the board.

4. The light-emitting diode arrangement according to claim 3, wherein the light-emitting diode chip does not project beyond a contour of the board.

5. The light-emitting diode arrangement according to claim 3, wherein the light-emitting diode chip ends flush with an upper side of the board.

6. The light-emitting diode arrangement according to claim 3, wherein the depression functions as a reflector.

7. The light-emitting diode arrangement according to claim 3, wherein the depression includes walls that are at least partially beveled.

8. The light-emitting diode arrangement according to claim 1, wherein the light-emitting diode chip is arranged in a region of a depression in the base layer material of the board.

9. The light-emitting diode arrangement according to claim 1, wherein the light-emitting diode chip is arranged so that the substrate of the light-emitting diode is towards the board.

10. The light-emitting diode arrangement according to claim 9, wherein a substrate of the light-emitting diode chip is of an electrically insulating material.

11. The light-emitting diode arrangement according to claim 10, wherein the substrate of the light-emitting diode chip is formed of sapphire.

12. The light-emitting diode arrangement according to claim 1, wherein the light-emitting diode chip is arranged so that a substrate of the light-emitting diode chip is away from the board.

13. The light-emitting diode arrangement according to claim 1, wherein the light-emitting diode chip is arranged on the intermediate carrier using a conductive adhesive.

14. The light-emitting diode arrangement according to claim 1, wherein a side of the intermediate carrier towards the board is electrically insulating.

15. The light-emitting diode arrangement according to claim 14, wherein a region on the intermediate carrier towards the light-emitting diode chip has conductive regions.

16. The light-emitting diode arrangement according to claim 1, wherein at least a region of the light-emitting diode chip is covered by a Fresnel lens.

17. The light-emitting diode arrangement according to claim 16, wherein a region between the board and the lens is at least partially filled by a color conversion material.

18. The light-emitting diode arrangement according to claim 17, wherein the color conversion material is arranged above and alongside the light-emitting diode chip.

19. The light-emitting diode arrangement according to claim 17, wherein the color conversion material fully encapsulates the light-emitting diode chip, the intermediate carrier and the electrically insulating and thermally conducting connection layer.

20. The light-emitting diode arrangement according to claim 1, wherein the light-emitting diode chip is connected to a circuit board using wires, and the circuit board is applied to the multi-layer board using an insulating layer positioned therebetween.

21. The light-emitting diode arrangement according to claim 1, further comprising a color conversion material arranged above and alongside the light-emitting diode chip.

22. The light-emitting diode arrangement according to claim 1, wherein the light-emitting diode chip is arranged on the intermediate carrier using a conductive adhesive.

\* \* \* \* \*